(12) United States Patent
Nordin et al.

(10) Patent No.: US 8,052,419 B1
(45) Date of Patent: Nov. 8, 2011

(54) CLOSED LOOP TEMPERATURE HEAT UP AND CONTROL UTILIZING WAFER-TO-HEATER PEDESTAL GAP MODULATION

(75) Inventors: Michael Nordin, San Jose, CA (US); Chris Gage, Campbell, CA (US); Shawn Hamilton, Boulder Creek, CA (US); Sheldon Templeton, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 582 days.

(21) Appl. No.: 11/937,364

(22) Filed: Nov. 8, 2007

(51) Int. Cl.
    H05B 3/68 (2006.01)
(52) U.S. Cl. ............ 432/247; 118/729; 219/443.1
(58) Field of Classification Search .......... 432/253, 432/258, 247, 249; 219/443.1, 444.1; 118/725, 118/729
    See application file for complete search history.

(56) References Cited

U.S. PATENT DOCUMENTS

| | | | |
|---|---|---|---|
| 3,612,825 A | 10/1971 | Chase et al. | |
| 4,457,359 A | 7/1984 | Holden | |
| 4,535,835 A | 8/1985 | Holden | |
| 4,563,589 A | 1/1986 | Scheffer | |
| 5,113,929 A | 5/1992 | Nakagawa et al. | |
| 5,178,682 A | 1/1993 | Tsukamoto et al. | |
| 5,228,208 A | 7/1993 | White et al. | |
| 5,282,121 A | 1/1994 | Bornhorst et al. | |
| 5,447,431 A | 9/1995 | Muka | |
| 5,558,717 A | 9/1996 | Zhao et al. | |
| 5,588,827 A * | 12/1996 | Muka | 432/5 |
| 5,811,762 A | 9/1998 | Tseng | |
| 6,072,163 A * | 6/2000 | Armstrong et al. | 219/497 |
| 6,087,632 A * | 7/2000 | Mizosaki et al. | 219/390 |
| 6,200,634 B1 | 3/2001 | Johnsgard et al. | |
| 6,214,184 B1 | 4/2001 | Chien et al. | |
| 6,228,438 B1 | 5/2001 | Schmitt | |
| 6,307,184 B1 | 10/2001 | Womack et al. | |
| 6,394,797 B1 | 5/2002 | Sugaya et al. | |
| 6,413,321 B1 | 7/2002 | Kim et al. | |

(Continued)

FOREIGN PATENT DOCUMENTS

JP   01-107519   4/1989

(Continued)

OTHER PUBLICATIONS

Shrinivasan et al., "Single-Chamber Sequential Curing of Semiconductor Wafers," Novellus Systems, Inc., U.S. Appl. No. 11/115,576, filed Apr. 26, 2005.

(Continued)

Primary Examiner — Gregory A Wilson
(74) Attorney, Agent, or Firm — Weaver Austin Villeneuve & Sampson LLLP (57) ABSTRACT

Methods and apparatuses that decouple wafer temperature from pre-heat station residence time, thereby improving wafer-to-wafer temperature uniformity, are provided. The methods involve maintaining a desired temperature by varying the distance between the wafer and a heater. In certain embodiments, the methods involve rapidly approaching a predetermined initial distance and then obtaining and maintaining a desired final temperature using closed loop temperature control. In certain embodiments, a heated pedestal supplies the heat. The wafer-pedestal gap may be modulated may be varied by moving the heated pedestal and/or moving the wafer, e.g., via a movable wafer support. Also in certain embodiments, the closed loop control system includes a real time wafer temperature sensor and a servo controlled linear motor for moving the pedestal or wafer support.

16 Claims, 7 Drawing Sheets

U.S. PATENT DOCUMENTS

| | | | |
|---|---|---|---|
| 6,467,491 | B1 | 10/2002 | Sugiura et al. |
| 6,559,424 | B2 | 5/2003 | O'Carroll et al. |
| 6,563,092 | B1 | 5/2003 | Shrinivasan et al. |
| 6,639,189 | B2* | 10/2003 | Ramanan et al. .......... 219/444.1 |
| 6,860,965 | B1 | 3/2005 | Stevens |
| 6,895,179 | B2 | 5/2005 | Kanno |
| 6,899,765 | B2 | 5/2005 | Krivts et al. |
| 7,138,606 | B2 | 11/2006 | Kanno et al. |
| 7,253,125 | B1 | 8/2007 | Bandyopadhyay et al. |
| 7,265,061 | B1 | 9/2007 | Cho et al. |
| 7,327,948 | B1 | 2/2008 | Shrinivasan et al. |
| 7,410,355 | B2* | 8/2008 | Granneman et al. .............. 432/5 |
| 2002/0117109 | A1 | 8/2002 | Hazelton et al. |
| 2002/0162630 | A1 | 11/2002 | Satoh et al. |
| 2003/0013280 | A1 | 1/2003 | Yamanaka |
| 2003/0113187 | A1 | 6/2003 | Lei et al. |
| 2004/0023513 | A1 | 2/2004 | Aoyama et al. |
| 2004/0060917 | A1* | 4/2004 | Liu et al. ...................... 219/390 |
| 2004/0183226 | A1 | 9/2004 | Newell et al. |
| 2004/0187790 | A1 | 9/2004 | Bader et al. |
| 2005/0045616 | A1 | 3/2005 | Ishihara |
| 2006/0018639 | A1 | 1/2006 | Ramamurthy et al. |
| 2006/0081186 | A1 | 4/2006 | Shinriki et al. |
| 2007/0107845 | A1 | 5/2007 | Ishizawa et al. |
| 2009/0060480 | A1* | 3/2009 | Herchen ...................... 392/416 |

FOREIGN PATENT DOCUMENTS

| | | |
|---|---|---|
| JP | 06/037054 | 2/1994 |
| JP | 07/147274 | 6/1995 |
| JP | 09-092615 | 4/1997 |
| JP | 2005/116655 | 4/2005 |
| KR | 2003/0096732 | 12/2003 |
| WO | 02/11911 | 2/2002 |

OTHER PUBLICATIONS

U.S. Office Action mailed Oct. 3, 2007, from U.S Appl. No. 11/115,576.

U.S. Final Office Action mailed May 2, 2008, from U.S Appl. No. 11/115,576.

U.S. Office Action mailed Oct. 17, 2008, from U.S Appl. No. 11/115,576.

Shrinivasan et al., "Pedestal Heat Transfer and Temperature Control," Novellus Systems, Inc., U.S. Appl. No. 11/851,310, filed Sep. 6, 2007.

Doble et al., "Concave Pedestal for Uniform Heating of Silicon Wafers," Novellus Systems, Inc., U.S. Appl. No. 11/546,189, filed Oct. 10, 2006.

Landess et al., "Tailored Profile Pedestal for Therm-Elastically Stable Cooling or Heating of Substrates," Novellus Systems, Inc., U.S. Appl. No. 11/129,266, filed May 12, 2005, pp. 1-25.

U.S. Office Action mailed Jun. 16, 2008, from U.S. Appl. No. 11/546,189.

U.S.Final Office Action mailed Oct. 16, 2008, from U.S. Appl. No. 11/546,189.

U.S. Office Action mailed Jul. 18, 2006, from U.S. Appl. No. 11/184,101.

Notice of Allowance and Fee Due mailed Jan. 25, 2007, from U.S. Appl. No. 11/184,101.

Allowed Claims from U.S. Appl. No. 11/184,101.

Rivkin et al., "Load Lock Design for Rapid Wafer Handling," Novellus Systems, Inc., U.S. Appl. No. 11/608,185, filed Dec. 7, 2006.

Gage et al., "Transferring Heat in Loadlocks," Novellus Systems, Inc., U.S. Appl. No. 12/140,196, filed Jun. 16, 2008.

Rivkin et al., "Photoresist Stripping Method and Apparatus," Novellus Systems, Inc., U.S. Appl. No. 61/050,880, filed May 6, 2008.

Gage et al., "Minimum Contact Area Wafer Clamping with Gas Flow for Rapid Wafer Cooling," Novellus Systems, Inc., U.S. Appl. No. 12/333,239, filed Dec. 11, 2008.

U.S. Appl. No. 11/115,576, Office Action mailed Apr. 22, 2009.

U.S. Appl. No. 11/115,576, Office Action mailed Apr. 15, 2010.

U.S. Appl. No. 11/129,266, "Tailored profile pedestal for thermo-elastically stable cooling for heating of substrates", Landess et al., filed May 12, 2005.

U.S. Appl. No. 11/129,266, Office Action mailed Feb. 20, 2009.

U.S. Appl. No. 11/129,266, Office Action mailed Oct. 28, 2009.

U.S. Appl. No. 12/749,170, "Tailored profile pedestal for thermo-elastically stable cooling or heating of substrates", Landess et al., filed Mar. 29, 2010.

U.S. Appl. No. 11/608,185, Office Action mailed Apr. 26, 2010.

U.S. Appl. No. 11/751,584, "Cast pedestal with heating element on coaxial heat exchanger", Shrinivasan et al., filed May 21, 2007.

U.S. Appl. No. 11/851,310, Office Action mailed Jun. 8, 2010.

U.S. Appl. No. 12/341,943, "Atomic layer removal for high aspect ratio gapfill", van Schranvendijk et al., filed Dec. 22, 2008.

U.S. Appl. No. 61/122,308, "Conductively cooled process for wide temperature range processes", Nich et al., filed Dec. 12, 2008.

U.S. Appl. No. 12/435,890, "Photoresist stripping method and apparatus", Rivkin et al., filed May 5, 2009.

U.S. Appl. No. 12/341,943, Office Action mailed Jun. 11, 2010.

International Search Report and Written Opinion for application No. PCT/US2009/067040, mailed Aug. 2, 2010.

* cited by examiner

CLOSED LOOP TEMPERATURE HEAT UP AND CONTROL UTILIZING WAFER-TO-HEATER PEDESTAL GAP MODULATION

BACKGROUND

In many processes in integrated circuit fabrication, wafers are required to be at elevated temperatures. Wafers may be heated prior to being transferred to a processing module, for example, in pre-heat stations in multi-station wafer processing equipment. Residence time at the pre-heat station may vary. This can lead to poor wafer-to-wafer temperature uniformity, since the wafer continues to approach a steady state temperature asymptotically as it waits for the process chamber to be ready for transfer of wafer.

SUMMARY OF THE INVENTION

Methods and apparatuses that decouple wafer temperature from pre-heat station residence time, thereby improving wafer-to-wafer temperature uniformity, are provided. The methods involve maintaining a desired temperature by varying the distance between the wafer and a heater. In certain embodiments, the methods involve rapidly approaching a predetermined initial distance and then obtaining and maintaining a desired final temperature using closed loop temperature control. In certain embodiments, a heated pedestal supplies the heat. The wafer-pedestal gap may be modulated by moving the heated pedestal and/or moving the wafer, e.g., via a movable wafer support. Also in certain embodiments, the closed loop control system includes a real time wafer temperature sensor and a servo controlled linear motor for moving the pedestal or wafer support.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances, which utilize well-known processes, procedures and components have not been described in detail so as not to unnecessarily obscure aspects of the present invention.

In this application, the terms "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

Prior to being placed in a processing chamber, wafers are often preheated. Preheating to a temperature at or near the process temperature increases process chamber throughput, as well reducing thermal stress to the wafer, improving temperature consistency across the wafer and improving deposited film quality and uniformity. With many apparatuses, a wafer is preheated while waiting for the processing station to be available. Once the processing station becomes available, the wafer is transferred from the preheat station to the available process module. In some processing stations, the wafer is preheated in a loadlock. The loadlock serves as a buffer between a room temperature, atmospheric-pressure environment and an elevated temperature, evacuated environment. Loadlock (or other preheat station) residence time may vary widely from wafer to wafer, however, because processing requirements and maximizing throughput necessitate that the processing chamber availability dictates the wafer transfer timing.

Figure 1:
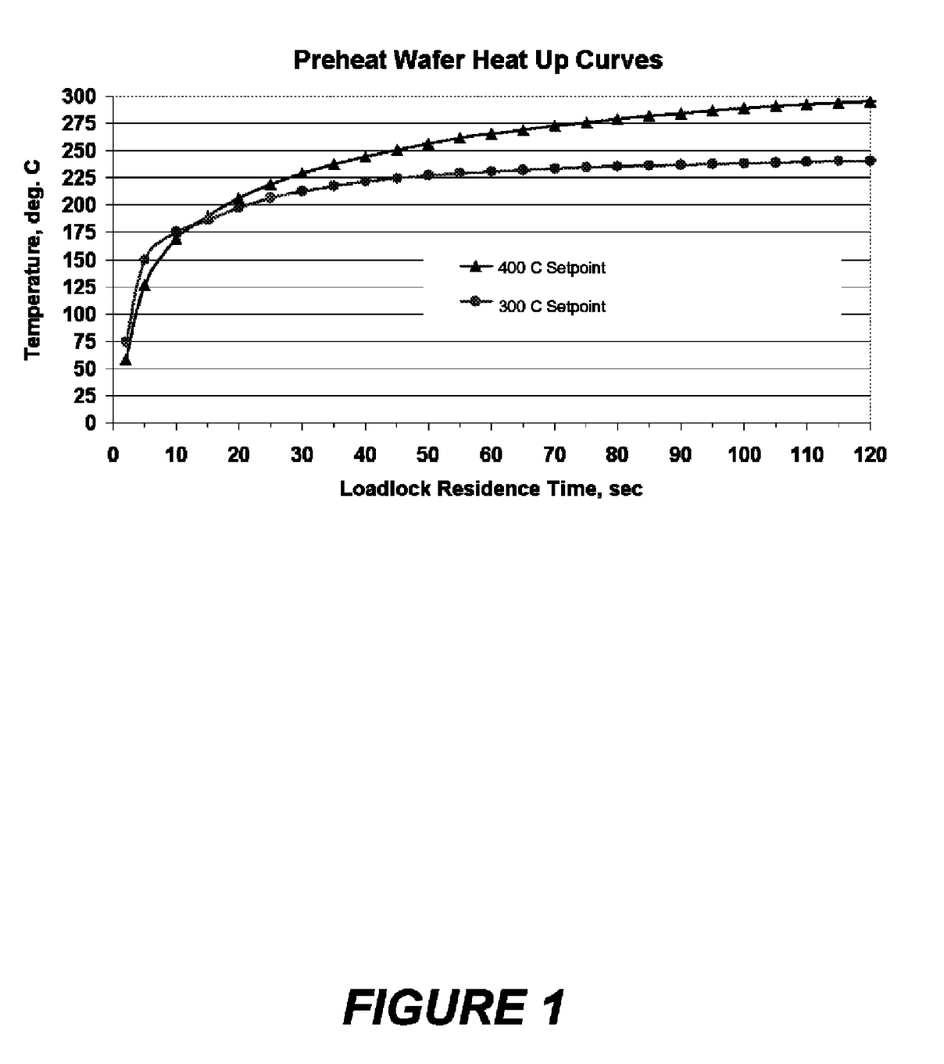
FIG. 1 is a graph showing wafer temperature as a function of loadlock (preheat station) residence time.

Wafer heating prior to processing is typically performed open loop with no control of final temperature. This can lead to poor wafer to wafer temperature uniformity, since the residence time at the pre-heat station may vary and the wafer temperature will continue to rise as the wafer waits for the process chamber to be ready for transfer. FIG. 1 shows wafer temperature as a function of loadlock residence time for two pedestal temperatures: 300 C and 400 C. In the preheat stations used to collect the data, and as in many preheat stations, the wafer is heated by a heated pedestal. As can be seen from the figure, uneven residence time in a loadlock or other preheat station results in poor wafer-to-wafer temperature uniformity. The wafer temperature approaches a steady state temperature asymptotically as the wafer continues to wait in the loadlock. For example, for a wafer on a 400 C pedestal, 30 seconds residence time results in a wafer temperature of about 225 C; 70 seconds results in a wafer temperature of about 275 C. Smaller variations in residence time also result in significant temperature differences. Poor wafer-to-wafer temperature uniformity leads to poor wafer-to-wafer deposition uniformity.

According to various embodiments, the methods and systems described herein involve closed loop feedback control for rapid wafer heating and maintaining target wafer temperature in a preheat station. In certain embodiments, the temperature control systems use wafer temperature sensor and a servo controlled actuator for controlling the rate of heat transfer by varying the gap between the heater and the wafer.

In many embodiments, a heated pedestal supplies the heat to heat the wafer. Heated pedestals generally have embedded electrically powered heating elements. The wafer may rest slightly above the pedestal on a wafer support, with heat transfer from the pedestal to the wafer facilitated by using a gas with high thermal conductivity (e.g., helium) to provide for efficient thermal coupling between the wafer and the pedestal or other support to the wafer. As indicated above, the methods and systems described herein control heat transfer from the heater to the wafer, and thus wafer temperature, by modulating the gap between the heater and wafer. For the purposes of discussion, the description refers to such heated pedestals; however the scope of the invention is not so limited and includes other heat sources wherein the rate of heat transfer can be controlled by modulating the gap between the heat source and the wafer, e.g. radiation-type heat sources, as well as those heat sources embedded within pedestals. Internal and external heat sources include, but are not limited to, resistance-type and circulating-type heat sources.

Figure 2:
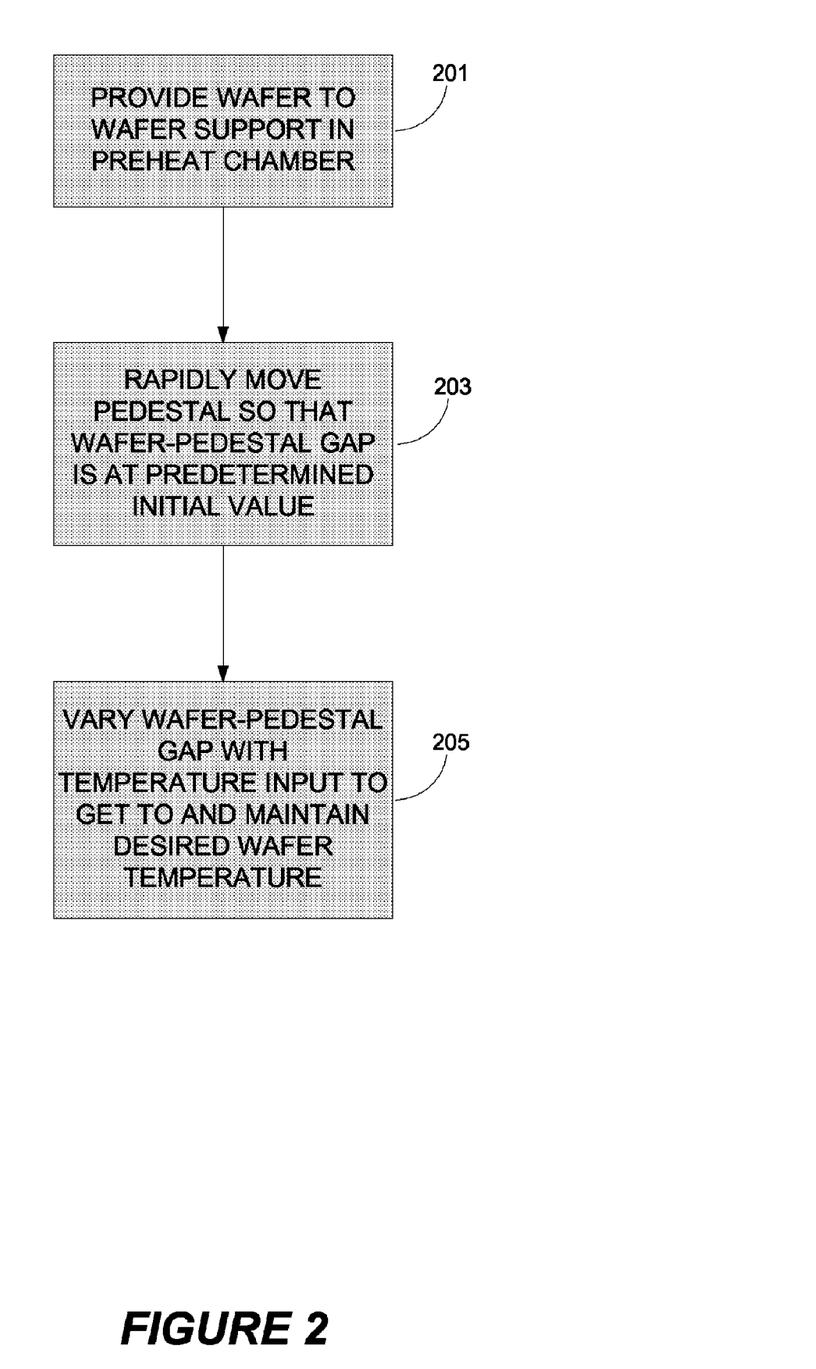
FIG. 2 is a process flowsheet illustrating important operations in a method of heating a wafer according to certain embodiments.

FIG. 2 is a process flowsheet displaying certain operations in a process of reaching and maintaining desired wafer temperature according to certain embodiments. In the process shown, the motion profile of the wafer-pedestal gap has two main stages: initial approach and closed loop control. First, in an operation 201, the wafer is provided to a wafer support in a preheat station. This typically involves placing the wafer on the wafer support using a wafer transfer robot. The wafer support may be a chuck, the pedestal surface, lift pins that hold the wafer above the pedestal surface, or any other appropriate wafer support. In certain embodiments, providing the wafer to the wafer support involves extending lift pins to receive the wafer from the robot, which is then retracted. In an operation 203, the pedestal is rapidly moved so that the wafer-pedestal gap approaches a predetermined initial gap. The predetermined initial gap is the gap at which the closed loop temperature control begins. The predetermined initial gap is typically at or close to the minimum gap necessary to maintain wafer integrity, i.e., to keep the wafer from becoming distorted, from contamination by the pedestal, etc. In some embodiments, the predetermined initial gap is the wafer distortion threshhold gap, the minimum gap at which the wafer does not experience thermal distortion. In an atmospheric nitrogen environment, this threshhold is about 0.05 inches for a 400 C pedestal. In general, the predetermined initial gap is not smaller than this threshhold. Next, in operation 205, the temperature is maintained by varying the wafer-pedestal gap with temperature input. If not already there, the temperature is brought to the desired value in this operation prior to maintaining the desired temperature. In certain embodiments, logic device controls instruct a servo motor to set a prescribed motion using a wafer temperature signal as input. The device may use PID algorithms for stable and accurate control.

Figure 3:
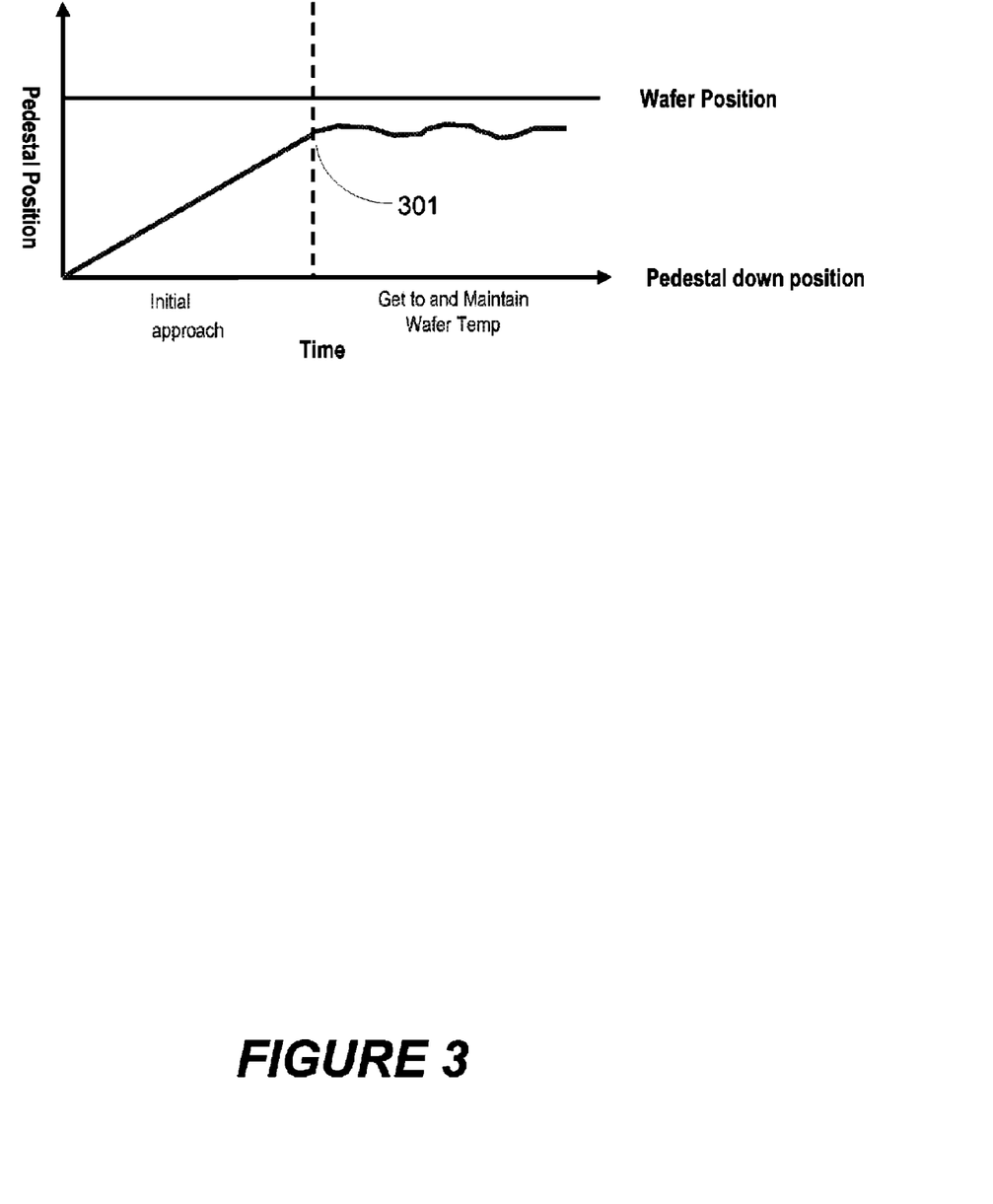
FIG. 3 is a graph showing pedestal position as a function of time using a temperature control system according to certain embodiments.

The two stages of wafer temperature control are illustrated in FIG. 3, a graph showing pedestal position as a function of time. In the graph shown, the pedestal starts at a 'pedestal down' position. In this embodiment the wafer position, indicated on the graph, is constant. The pedestal is moved to the predetermined initial gap rapidly during the initial approach. In the figure, the pedestal is moved from the down position to the predetermined initial gap at a constant velocity; the pedestal may approach the predetermined initial gap at a variable velocity as well. Typically, the initial approach is the same from wafer to wafer for a particular preheat process, i.e., the pedestal starts at a standard position such as the pedestal down position indicated in FIG. 3 and moves along a standard path to the predetermined initial gap. Once at the predetermined initial gap, the closed loop temperature control begins. This is indicated at 301. Signals from thermometry equipment are sent to a controller, which then sends signals to a motor to move the pedestal closer to or further from the wafer as required to obtain and maintain the desired final temperature. The range of allowable gaps is generally limited by the maximum allowable distance the equipment can achieve (e.g., the pedestal down position) and a minimum gap that ensures wafer integrity. As indicated, in some embodiments, the latter is the wafer distortion threshold gap. In the example of FIG. 3, the pedestal is moved slightly up and down to maintain the wafer temperature control. Without varying the wafer-pedestal gap, the wafer temperature would asymptotically approach a steady state temperature as shown in FIG. 1. In other embodiments, the wafer may be provided to the preheat station at the predetermined initial gap, at which point the feedback control begins. This often means that wafer will stay at this small gap until it nears the desired final temperature.

The initial approach parameters typically include a set velocity or set acceleration and the predetermined initial gap. The feedback control stage parameters include a max velocity, a max acceleration and a minimum gap. The predetermined initial gap may be experimentally determined for each type of wafer/desired temperature/pedestal temperature. In addition to constraining the predetermined initial gap to distances above that of the thermal distortion threshold gap, the gap should be big enough so that any variation in wafer-pedestal gap across the wafer (due to, for example, variations in the pedestal surface) is insignificant compared to the gap. In certain embodiments, this initial gap may also be set to be the minimum gap during the feedback control stage. In certain embodiments the minimum gap used during the feedback control stage differs from the predetermined initial gap. For example, because the thermal distortion threshold gap is dependent on the temperature differential between the wafer and the pedestal, becoming smaller as the temperature differential becomes smaller, this minimum gap may be smaller than the predetermined initial gap.

The initial approach stage described above is just one example of a stage prior to a feedback control stage. For example, the initial approach stage may be broken up into two or more stages, having different gaps, approach velocities, etc. As mentioned, in certain embodiments, there may be no initial approach, with the feedback control stage beginning immediately after introducing the wafer to the station.

Figure 4:
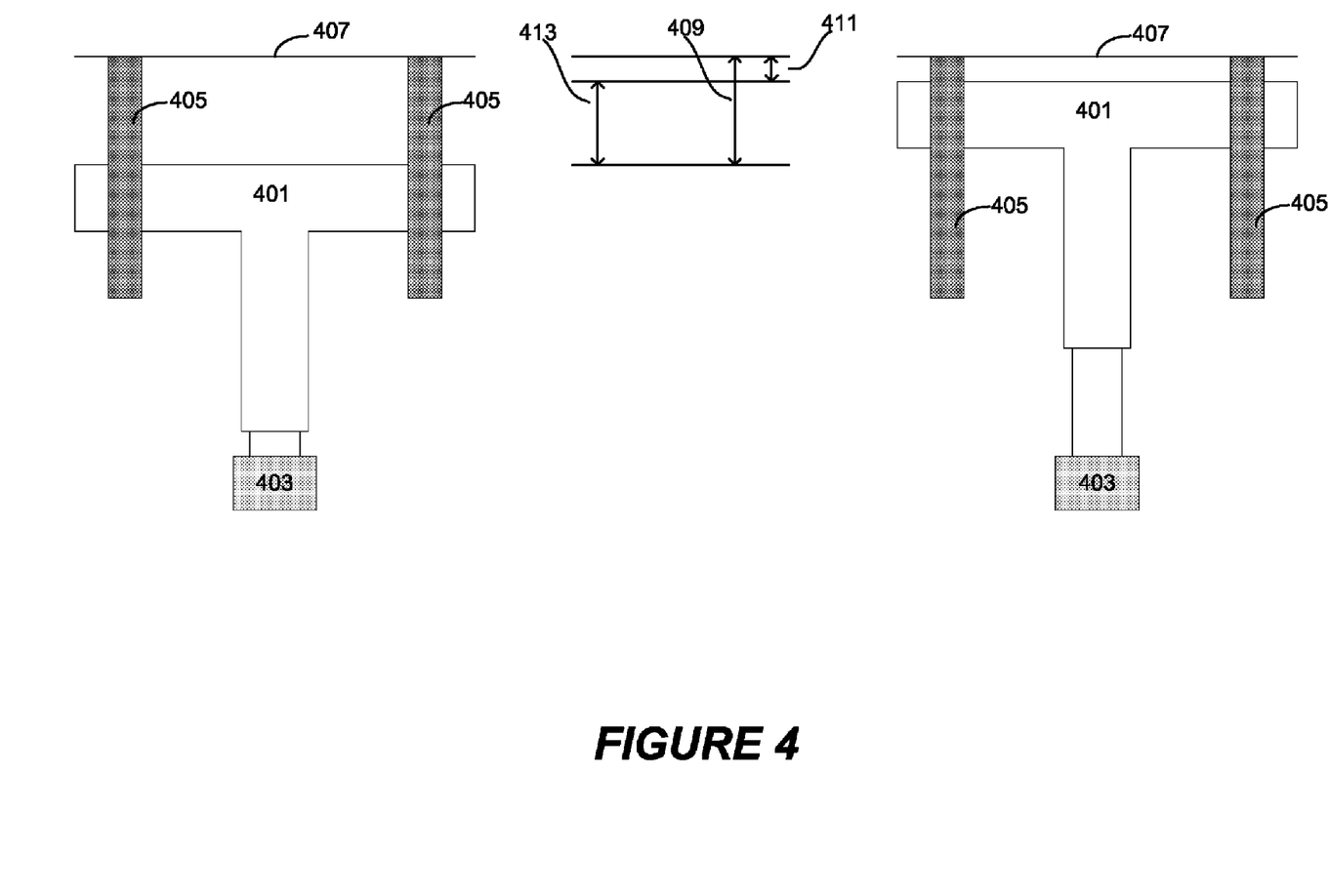
FIG. 4 is a schematic illustration showing a cross-section of a preheat station having a movable heated pedestal according to certain embodiments.
Figure 5:
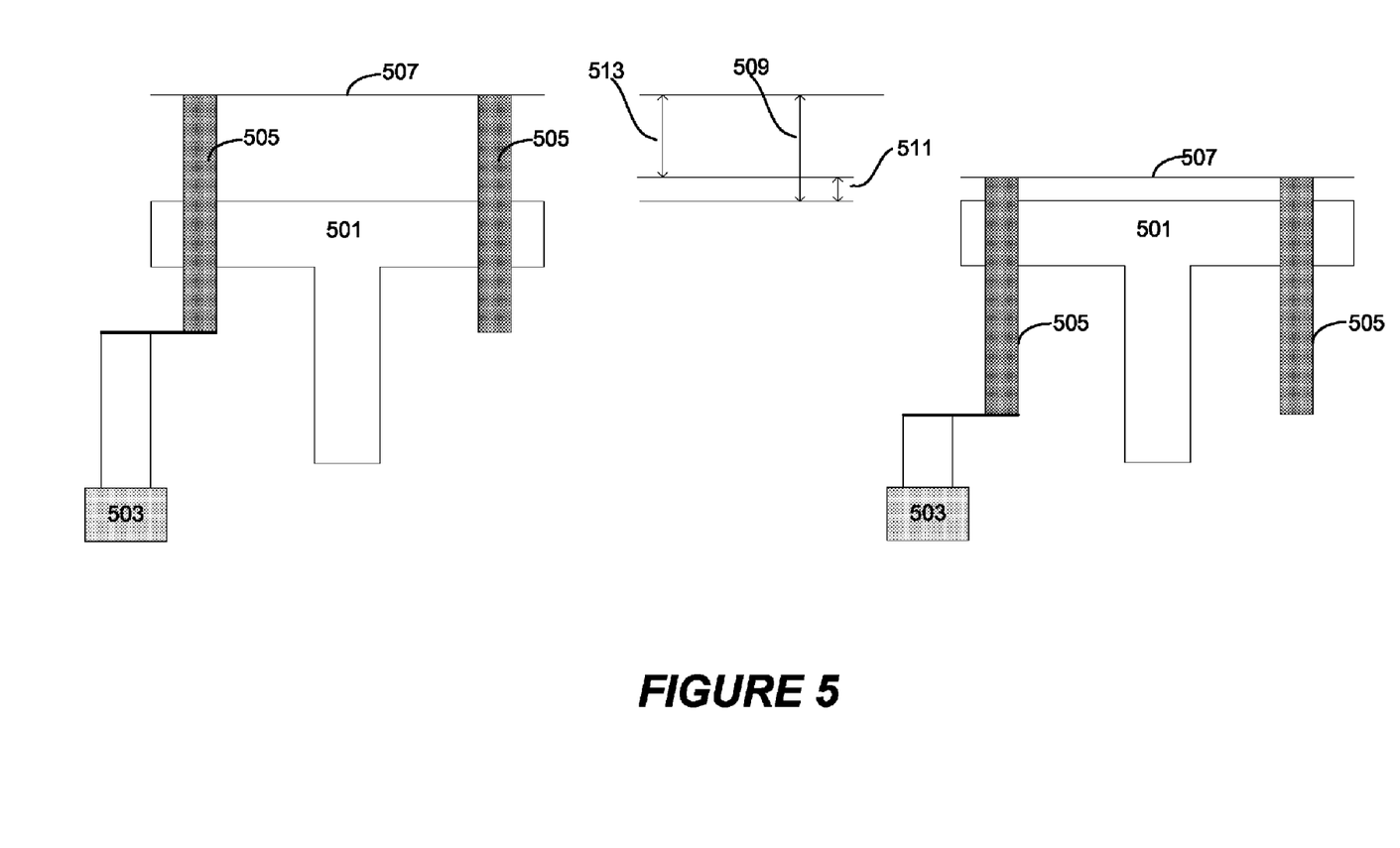
FIG. 5 is a schematic illustration showing a cross-section of a preheat station having a movable wafer support according to certain embodiments.

FIGS. 2 and 3 discuss embodiments in which a heated pedestal is moved to vary the gap between the pedestal and the wafer while the wafer position is held steady. In other embodiments the pedestal is held steady, while the gap is modulated by moving the wafer support. FIG. 4 is a schematic of a preheat station illustrating one embodiment in which the pedestal moves. Wafer 407 rests on pins 405. Any other appropriate wafer support may be used, including a plate resting on pins, for example. Pedestal 401 has embedded heating elements (not shown) to provide heat to the wafer and is connected to a motor 403 to move it in relation to wafer 407. The pedestal 403 moves between the pedestal down position and the threshold distortion gap. The maximum gap 409 (when the pedestal is in the down position) and the minimum gap 411 (threshold distortion gap) are indicated in the figure. The max and min gaps determine the pedestal range of motion 413. As indicated above, in certain embodiments, once the wafer is provided to the preheat station, the pedestal rapidly moves from the pedestal down position to the threshold distortion gap. At that point, thermometry equipment (not shown) sends an input signal to a controller (not shown), which sends instructions to the motor to move to maintain the wafer temperature. FIG. 5 shows another example of a preheat station according to certain embodiments. In this example, wafer 507 rests on pins 505 above heated pedestal 501. Pins 505 are connected to a motor 503 that moves in response to a controller (not shown) to control the rate of heat transfer from the pedestal to the wafer.

Figure 6:
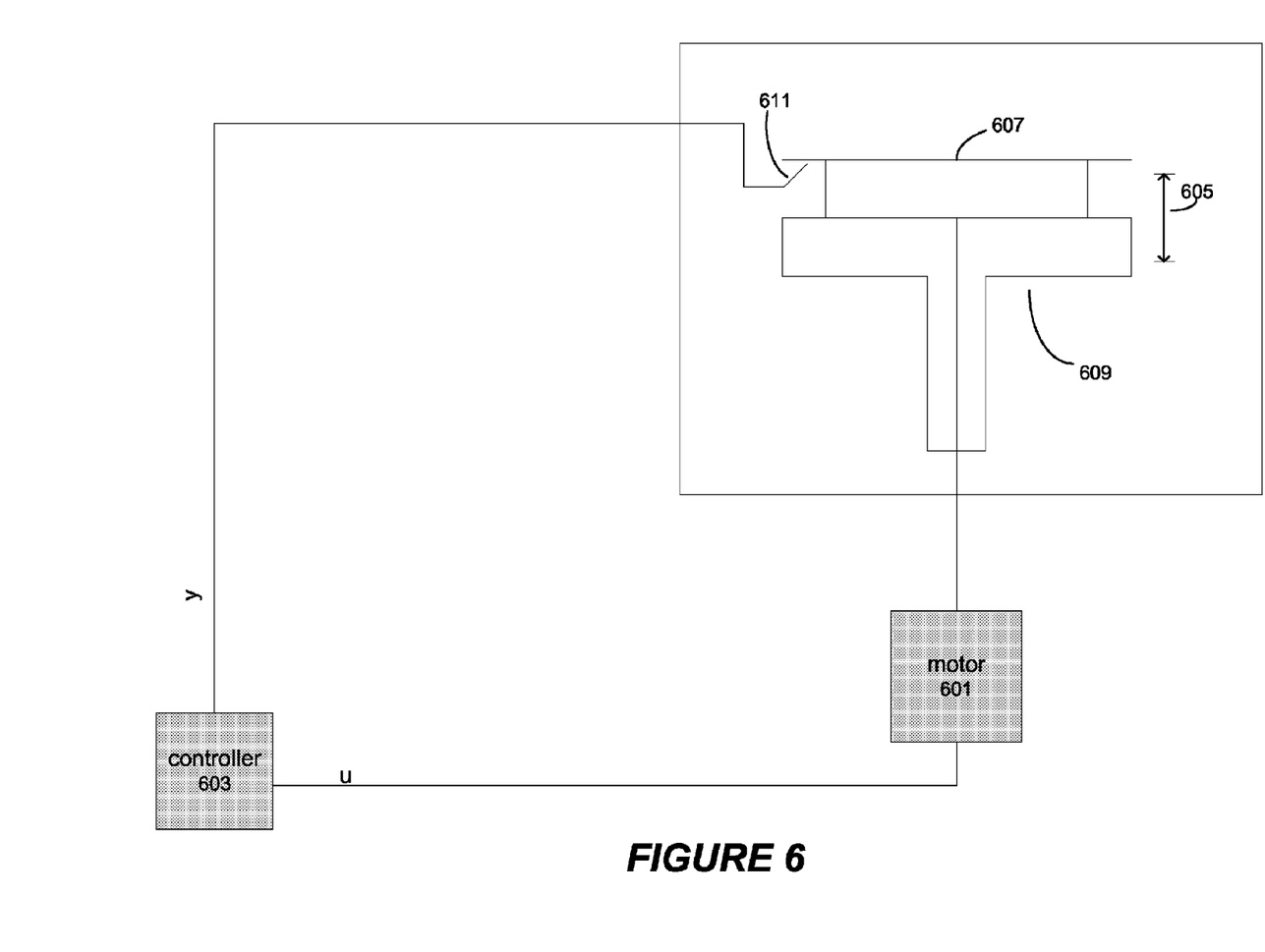
FIG. 6 is a block diagram illustrating a temperature control system according to certain embodiments.

FIG. 6 is a block diagram showing basic components of the temperature control system according to certain embodiments. Wafer 607 rests on a wafer support above heated pedestal 609, which has a range of motion as indicated at 605. A thermocouple 611 is near to the peripheral edge of the wafer to sense the temperature of the wafer. Output voltage from the thermocouple is sent to controller 603, e.g., via a wire or other connection. The controller sends a signal to the motor 601 in response to the signals received from the thermocouple.

Temperature measurement may be performed by any suitable device including a thermocouple, as in FIG. 6, a pyrometer, an emissometer that measures the infrared radiation coming off the wafer, etc. Generally, a no-contact temperature measuring device is used to avoid tainting or damaging the wafer. If a contact device is used, it may contact the underside or edge of the wafer rather than the topside. In a particular embodiment, a blackbody may be placed next to the wafer, with a thermocouple in the blackbody to monitor temperature. In certain embodiments, one or more thermocouples are suspended or supported near the wafer. Multiple thermocouples placed at different points may be used to supply additional temperature information. The thermocouple outputs a direct voltage that is an indicator of temperature.

As indicated, the temperature sensing device sends wafer temperature information to a controller, generally in the form of an output voltage. The controller analyzes the data and in turn sends instructions to a linear motor to modulate the wafer-pedestal gap and keep the temperature at the desired level. In general, accurate feedback control with small overshoot is necessary. In certain embodiments, the controller is programmed with Proportional Integral Derivative (PID) algorithms for stable and accurate control. In certain embodiments, the motor used to move the pedestal and/or wafer support is a servo controlled linear actuator motor, which receives instructions for a prescribed motion based on input from the thermometry equipment. The motor may have embedded logic circuitry to support the PID closed loop algorithms for gap variance.

As indicated above, the wafer-pedestal gap may be modulated by moving the pedestal or a wafer support holding the wafer in relation to each other. In certain embodiments, both may be capable of moving in response to modulate the gap. Any type of pedestal may be used including convex, concave or flat pedestals in various shapes and sizes. The pedestal typically has a heating element and has a thermocouple to control its temperature. In certain embodiments, the temperature is constant and the rate at which heat transfers to the wafer is controlled primarily by modulating the wafer-pedestal gap. However, in some embodiments, the pedestal heater power may also be varied.

The closed loop temperature control using gap variance to control the temperature as discussed above provides easier to implement and low cost alternatives to other closed loop wafer control systems that would use variance in light source, plasma intensity or power supplied to the heater.

EXPERIMENTAL

Figure 7:
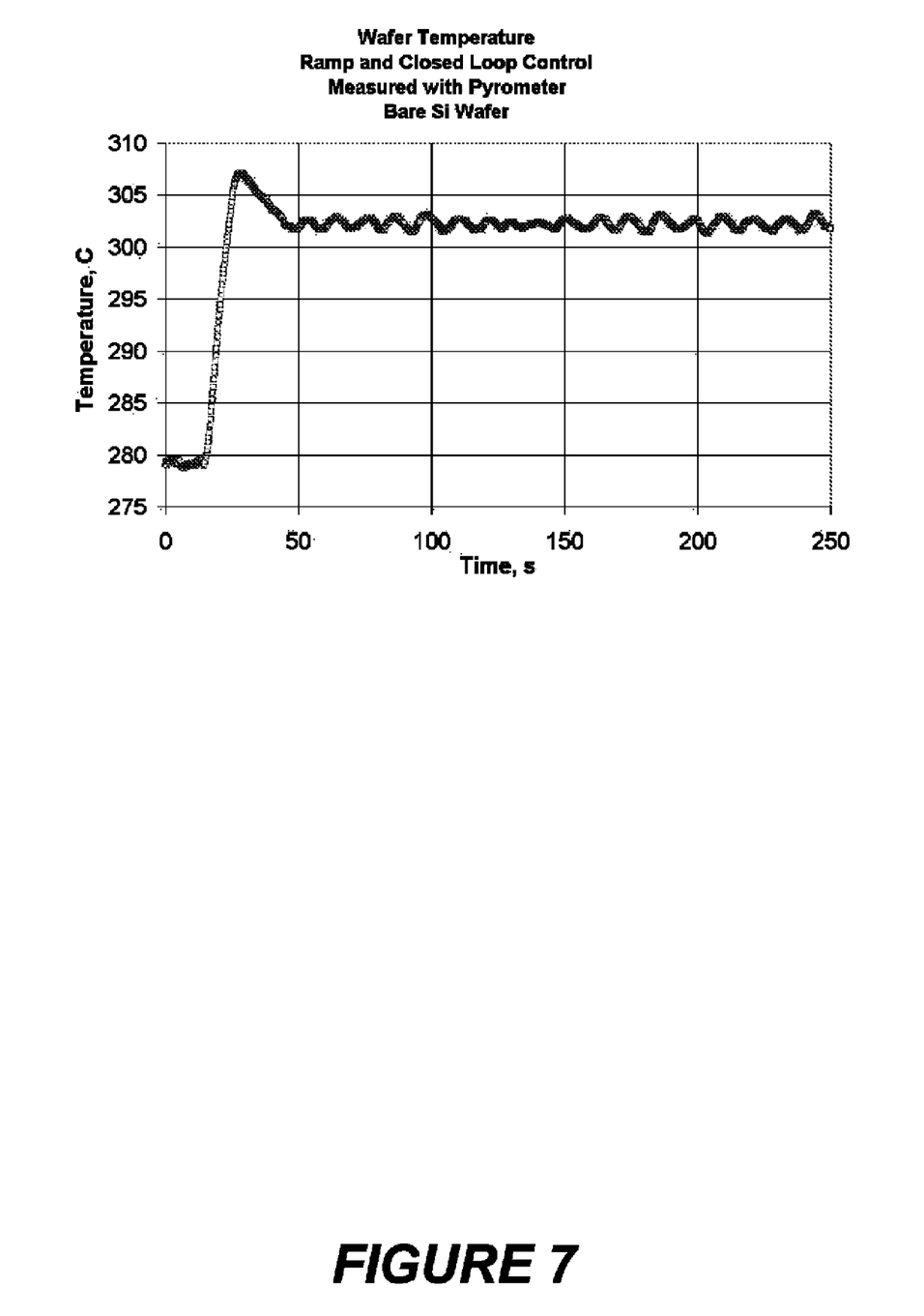
FIG. 7 is a wafer temperature profile from a wafer preheated using certain embodiments of the methods described herein.

A bare silicon wafer was introduced to a chamber having a heated pedestal capable of moving with respect to the wafer to modulate the wafer-pedestal gap. The pedestal temperature was 400 C. Wafer temperature was measured using a pyrometer. Initial approach and closed loop control stages were performed to maintain temperature at about 300 C as follows:

Initial Approach Stage:
  Wafer temperature at beginning of initial approach: 280 C
  Wafer-Pedestal gap at beginning of initial approach: 0.4 inch
  Predetermined initial gap (wafer-pedestal gap at end of initial approach): 0.10 inch
  Pedestal velocity during initial approach: 0.04 inch per second
  Pedestal acceleration during initial approach: 0.19 inch per $s^2$
Closed-Loop Temperature Control Stage: (Values Below are Typical Values Used During the Optimization of the Process)
  Minimum allowable gap: 0.07 inch
  Maximum pedestal velocity: 0.60 inch per second
  Maximum pedestal acceleration: 3.9 inch per $s^2$ The resulting wafer temperature profile is shown in FIG. 7. The wafer was successfully heated up and controlled to within 2 C of the desired temperature.

What is claimed is:

1. A method of heating a wafer comprising:
providing a wafer to a chamber having a heated pedestal;
heating the wafer with heat from said heated pedestal;
monitoring a temperature of the wafer with a closed loop temperature control system, and
providing temperature feedback from the temperature control system to vary the distance between the wafer and the heated pedestal.

2. The method of claim 1 wherein the heated pedestal is equipped with a servo controlled linear motor.

3. The method of claim 1 wherein the wafer is supported by a wafer support equipped with a servo controlled linear motor.

4. The method of claim 1 wherein the temperature control system employs a PID controller.

5. The method of claim 1 wherein wafer support is equipped with a servo controlled linear motor.

6. The method of claim 1 wherein the moving the pedestal or wafer support comprises moving the pedestal or wafer support at a velocity of at least 0.04 inch per second.

7. The system of claim 1 wherein the controller to generate a feedback control signal comprises a PID controller.

8. The method of claim 1 wherein the temperature of the heated pedestal is maintained a constant temperature during wafer heating.

9. A method of heating a wafer comprising:
providing a wafer to a wafer support in proximity to heated pedestal;
moving the pedestal and/or wafer support such that the gap between the pedestal and the wafer reaches a predetermined distance;
after the gap reaches the predetermined distance, monitoring a temperature of the wafer with a closed loop temperature control system; and
providing temperature feedback from the temperature control system to control the temperature by varying the gap between the wafer and the heated pedestal in response to the temperature feedback.

10. The method of claim 1 wherein the predetermined gap is greater than the wafer distortion threshold gap.

11. The method of claim 1 wherein the heated pedestal is equipped with a servo controlled linear motor.

12. The method of claim 9 wherein the temperature of the heated pedestal is maintained a constant temperature during wafer heating.

13. A system for bringing a wafer to a set-point temperature and maintaining that temperature, comprising:

a wafer support structure configured to hold a wafer;

a measuring apparatus disposed to monitor the temperature of the wafer;

a heater to provide heat to the wafer;

a controller comprising instructions to generate and send a feedback control signal to a servo linear motor in response to the monitored temperature; and the servo linear motor configured to move the wafer support structure or the heater in relation to the other in response to the feedback control signal.

14. The system of claim 13 wherein the servo linear motor is configured to move the wafer support structure in response to the feedback control signal.

15. The system of claim 13 wherein the servo linear motor is configured to move the heater in response to the feedback control signal.

16. The system of claim 13 wherein the heater is a heated pedestal.

* * * * *